(12) United States Patent
Nagata et al.

(10) Patent No.: US 7,020,033 B2
(45) Date of Patent: Mar. 28, 2006

(54) SEMICONDUCTOR MEMORY APPARATUS AND SELF-REPAIR METHOD

(75) Inventors: Kou Nagata, Kanagawa (JP); Hiroaki Kodama, Chiba (JP)

(73) Assignee: Sony Corporation, (JP)

( * ) Notice: Subject to any disclaimer, the term of this patent is extended or adjusted under 35 U.S.C. 154(b) by 133 days.

(21) Appl. No.: 10/827,351

(22) Filed: Apr. 20, 2004

(65) Prior Publication Data
US 2004/0246791 A1    Dec. 9, 2004

(30) Foreign Application Priority Data
May 1, 2003    (JP) .............................. 2003-126597

(51) Int. Cl.
*G11C 7/00* (2006.01)
(52) U.S. Cl. ...................... 365/200; 365/201
(58) Field of Classification Search ................ 365/200, 365/201, 230.03, 189.08, 189.03, 225.7
See application file for complete search history.

(56) References Cited

U.S. PATENT DOCUMENTS 6,574,757 B1 *   6/2003  Park et al. .................. 714/710
2004/0208070 A1 * 10/2004  Nagata et al. .............. 365/201
2005/0007841 A1 *  1/2005  Nagata et al. .............. 365/200

FOREIGN PATENT DOCUMENTS

JP        07-146340       6/1995
JP        2002-117697     4/2002

* cited by examiner

*Primary Examiner*—Richard Elms
*Assistant Examiner*—Hien Nguyen
(74) *Attorney, Agent, or Firm*—Rader, Fishman & Grauer PLLC; Ronald P. Kananen

(57) ABSTRACT

A memory unit includes unit blocks laid out to form a block matrix. Each of the unit blocks has a plurality of memory cells laid out to form a cell matrix and redundant lines including redundant memory cells each used for repairing an abnormal memory cell. Every plurality of unit blocks forms a two-dimensional group oriented in a first direction and a second direction, and the redundant lines connected in the first and second directions are shared by the unit blocks pertaining to the two-dimensional group. Self-repair means embedded in the same chip as the memory unit stores only a minimum number of address pairs in storage means provided for each of the unit blocks as address pairs required for determining a redundant line to be used for repairing an abnormal memory cell and, then, finds a redundant line to be used for repairing an abnormal memory cell for each of the unit blocks pertaining to the two-dimensional group on the basis of the address pairs stored in the storage means.

13 Claims, 10 Drawing Sheets

FIG. 4

| EXISTENCE BIT | X MASK BIT | XD BIT | X ADDRESS | Y ADDRESS | YD BIT | Y MASK BIT |
|---|---|---|---|---|---|---|
| 1 | 0 | 0 | 12 | 5 | 0 | 0 |
| 1 | 0 | 0 | 6 | 5 | 1 | 1 |
| 1 | 1 | 1 | 12 | 8 | 0 | 0 |
| 1 | 0 | 0 | 5 | 35 | 0 | 0 |
| 1 | 0 | 1 | 6 | 35 | 1 | 0 |
| | | | | | | |
| | | | | | | |
| | | | | | | |

OVERFLOW
0

F I G. 5
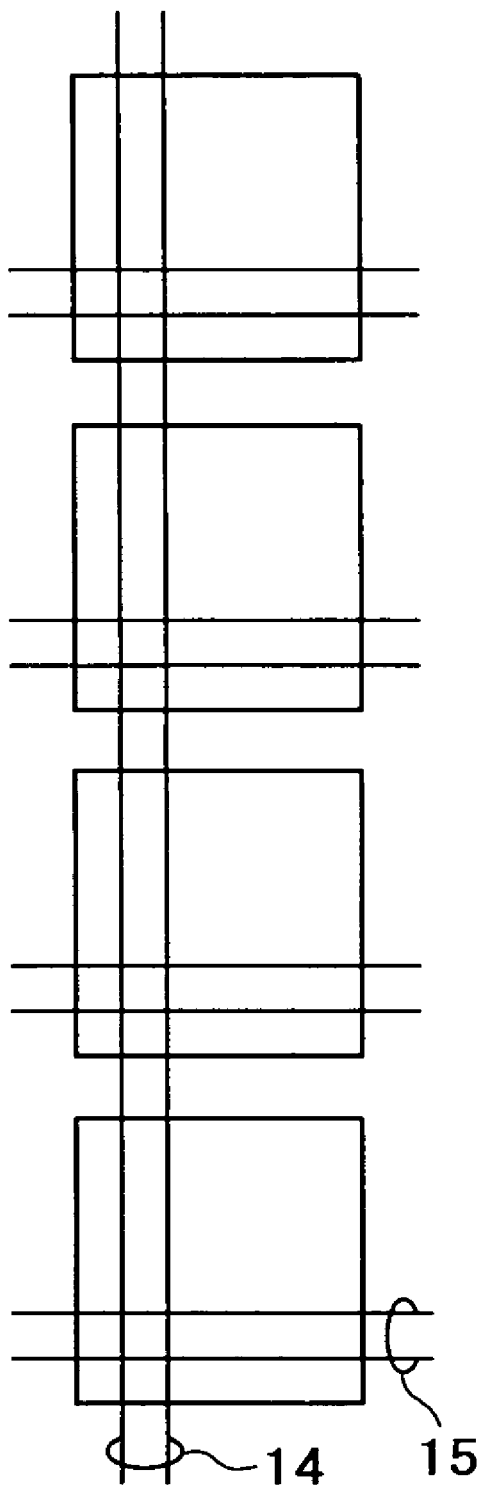

SEMICONDUCTOR MEMORY APPARATUS AND SELF-REPAIR METHOD

BACKGROUND OF THE INVENTION

The present invention relates to a semiconductor memory apparatus such as a DRAM (Dynamic Random Access Memory) or an SRAM (Static Random Access Memory) as well as relates to a self-repair method adopted in the semiconductor memory apparatus. More particularly, the present invention relates to a semiconductor memory apparatus having a redundancy search circuit for replacing a bad (defective) memory cell with a redundant memory cell included in the semiconductor memory apparatus in advance as well as relates to a self-repair method adopted in the semiconductor memory apparatus.

In a semiconductor memory apparatus such as a DRAM, the integration scale is extremely large and, in consequence, the yield becomes a big problem of fabrication in recent years. Practically, it is almost impossible to increase the yield to 100% so that one may assume that a defective memory cell always exists in a semiconductor memory apparatus. A defective memory cell is also referred to hereafter as an abnormal bit. If a defective memory cell exists in a semiconductor memory apparatus, however, the apparatus cannot of course be shipped as a product.

In order to solve the problem described above, in actuality, some spare memory cells are provided in advance and, if a defective memory cell is detected, the defective memory cell is replaced with one of the spare memory cells to rescue the semiconductor memory apparatus. To put it concretely, spare memory cells are each provided to serve as a redundant memory cell and, if a defective memory cell exists, a bit or address line including the defective memory cell is replaced with a redundant line including spare cells. In the case of the conventional semiconductor memory apparatus, a memory cell is determined to be normal or defective at a stage of shipping the memory apparatus from the factory by using a memory tester external to the semiconductor memory apparatus at the factory.

In the mean time, LSI technologies have been improved substantially in recent years. With the improvement of the LSI technologies, the number of apparatuses, in which a plurality of memories coexists with logic circuits in the same LSI chip, increases. It is thus practically difficult to test the individual memories of the same LSI chip independently of each other. In addition, as the operating speed of the LSI chip becomes higher, it becomes difficult to evaluate the performance of a memory by using an external memory tester. For these reasons, a memory-testing method embedded in an LSI chip is indispensable to the chip. In addition, even if a memory can be tested by using an external memory tester, such a memory tester is extremely expensive. Thus, since the cost of testing a memory in a fabrication process has been increasing considerably in recent years, it is desirable to provide a method, which allows an LSI a memory to be tested at a high speed equal to the operating speed of the LSI chip and can be implemented at a low cost.

With regard to the testing and evaluation of a semiconductor memory apparatus, as described earlier, each bit or each memory cell in an LSI chip is evaluated to determine whether the bit or the cell is normal or defective. A portion embedded in the LSI chip as a portion for evaluating memory cells is generally referred to as a BIST (Built-In Self Test) circuit. In the current situation, test circuits available in the market are mostly provided for SRAMs, and each manufacturer is developing a DRAM-oriented test circuit suitable for the original DRAM architecture of the manufacturer.

The BIST circuit determines whether or not an abnormal (defective or bad) bit (memory cell) exists in a memory and, if an abnormal bit exists, determines what address the bit is located at. A semiconductor memory apparatus includes a dummy bit or word line to restore the abnormal bit detected by the BIST circuit. The dummy bit or word line is referred to as a redundant line. The BIST circuit carries out processing only to find an abnormal bit. Thus, a later process determines how a redundant line is actually used.

A plurality of redundant lines is provided in the column and row directions. It is therefore necessary to determine how an abnormal bit is to be interpolated by using a redundant line and which redundant line is to be used for interpolating the abnormal bit. The work to interpolate an abnormal bit by using a redundant line as such is referred to as a repair and the work to determine which redundant line is to be used for interpolating an abnormal bit is referred to as a repair search. The work to actually complete a repair after determining a mask address in an LSI chip is referred to as a BISR (Built-In Self-Repair) or merely a self-repair.

If an external memory tester is used, a repair-search calculation is carried out by using a computer employed in the external memory tester. For more information, refer to documents such as patent reference 1. Besides the evaluation function to determine whether or not an abnormal bit exists, a repair-search (redundancy-analysis) function is added to the BIST circuit embedded in an LSI chip. The repair-search (redundancy-analysis) function is a function to determine which redundant line is to be used for interpolating an abnormal bit. For more information, refer to documents such as patent reference 2.

[Patent Reference 1]
Japanese Patent Laid-open No. Hei7-146340
[Patent Reference 2]
Japanese Patent Laid-open No. 2002-117697

Even in the case of an LSI chip including an embedded BIST circuit, however, a problem remains to be solved if the chip is tested in a configuration wherein information on normality/abnormality for each bit is transferred to a memory of an external computer and the external computer is used for carrying out a repair-search calculation as is the case with the conventional technology disclosed in patent reference 1. This is because a memory with a large storage capacity for storing the information on normality/abnormality for each bit is required of the external computer and it takes very long time to carry out the calculation.

Even if the BIST circuit embedded in the LSI chip is provided with a repair-search function as is the case with the conventional technology disclosed in patent reference 2, a plurality of repairable combination types is conceivable. In an example given in the reference, the number of repairable combination types is 6. This technology adopts a technique whereby a storage location for storing addresses for all these combinations is provided and repair possibility for all the 6 types is verified at the same time. Thus, the scale of the circuit conceivably increases.

SUMMARY OF THE INVENTION

It is thus an object of the present invention addressing the problems described above to provide a semiconductor memory apparatus capable of carrying out a repair search at a high speed but at a small circuit scale in a configuration providing a BIST circuit embedded in the semiconductor memory apparatus with a repair-search function and provide a self-repair method capable of carrying out a self repair completely on the chip of the semiconductor memory apparatus.

According to an aspect of the present invention, there is provided a semiconductor memory apparatus including:

a memory unit having unit blocks each including:

a memory core including a plurality of memory cells laid out to form a cell matrix; and redundant lines including redundant memory cells each used for repairing an abnormal memory cell generated in any of the memory cores, wherein:

the unit blocks are further laid out to form a block matrix or a plurality of block matrixes, and every plurality of the unit blocks forms a two-dimensional group oriented in a first direction (row or column direction) and a second direction (column or row direction); and the redundant lines are shared by the unit blocks pertaining to the two-dimensional group in both the first and second directions;

self-test means mounted in the same chip as the memory unit to serve as embedded self-test means for evaluating the memory cells in order to determine whether the memory cells are good or defective; and self-repair means mounted in the same chip as the memory unit to serve as embedded self-repair means for:

selecting only a minimum number of address pairs among address pairs received from the self-test means as address pairs each including a first-direction address (row or column address) and second-direction address (column or row address) of an abnormal memory cell;

storing the selected minimum number of address pairs in storage means provided for each of the unit blocks as address pairs required for determining a redundant line to be used for repairing an abnormal memory cell; and finding a redundant line to be used for repairing an abnormal memory cell for each of the unit blocks pertaining to the two-dimensional group on the basis of address pairs stored in the storage means.

According to another aspect of the present invention, there is provided a self-repair method adopted in a semiconductor memory apparatus including:

a memory unit having unit blocks each including:

a memory core including a plurality of memory cells laid out to form a cell matrix; and redundant memory cells each used for repairing an abnormal memory cell generated in any of the memory cores, wherein:

the unit blocks are further laid out to form a block matrix or a plurality of block matrixes, and every plurality of the unit blocks forms a two-dimensional group oriented in a first direction (row or column direction) and a second direction (column or row direction); and the redundant lines are shared by the unit blocks pertaining to the two-dimensional group in both the first and second directions; and self-test means mounted in the same chip as the memory unit to serve as embedded self-test means for evaluating the memory cells in order to determine whether the memory cells are good or defective, the self-repair method including:

a storage process of storing address pairs each consisting a first-direction address (a row address or a column address) and second-direction address (column address or row address) of an abnormal memory cell in storage means provided for each of the unit blocks;

a first confirmation process of determining whether or not it is possible to repair an abnormal memory cell in each of the unit blocks sharing the redundant lines connected in the second direction and pertaining to any particular one of second-direction one-dimensional subgroups composing the two-dimensional group on the basis of address pairs stored in the storage means in the storage process; and a second confirmation process of reflecting a determination result produced in the first confirmation process for any particular one of the second-direction one-dimensional subgroups in the unit blocks pertaining to any other one of the second-direction one-dimensional subgroups, which is provided at a location separated away in the first direction from the particular second-direction one-dimensional subgroup, and determining whether or not it is possible to repair an abnormal memory cell in each of the unit blocks pertaining to the other second-direction one-dimensional subgroup, whereby the first and second confirmation processes are carried out repeatedly to determine whether or not it is possible to repair an abnormal memory cell in each of the unit blocks pertaining to the two-dimensional subgroup.

In the semiconductor memory apparatus having the configuration described above, the memory unit includes unit blocks laid out to form a block matrix. Each of the unit blocks has a plurality of memory cells laid out to form a cell matrix and redundant lines including redundant memory cells each used for repairing an abnormal memory cell. Every plurality of unit blocks forms a rectangular two-dimensional group oriented in a first direction and a second direction, and the redundant lines connected in the first and second directions are shared by the unit blocks pertaining to the two-dimensional group. The embedded self-test means evaluates the memory cells in order to determine whether the memory cells are good or defective and supplies information on addresses of abnormal memory cells to the embedded self-repair means. Receiving the information on addresses of abnormal memory cells, the embedded self-repair means selects only a minimum number of address pairs from the information, stores the selected minimum number of address pairs in storage means for each of the unit blocks as address pairs required for determining a redundant line to be used for repairing an abnormal memory cell and, then, finds a redundant line to be used for repairing an abnormal memory cell for each of the unit blocks pertaining to the two-dimensional group on the basis of the address pairs stored in the storage means.

The selected minimum number of address pairs means a buffer size required of the storage means as follows. Assume for example that there are m redundant lines connected in the row direction and n redundant lines connected in the column direction. In this case, the buffer size of the storage means for storing address pairs is a size equivalent to 2×m×n address pairs for each unit block.

As described above, in accordance with the present invention, redundant lines are used in a structure where the redundant lines are shared by a plurality of redundant blocks laid out in two-dimensional directions. In this case, the mask address of a redundant line can be determined in an on-chip process. With such an on-chip process, an abnormal bit can be repaired not only at the time the chip is shipped from the factory, but also after the chip is delivered to the user as a product by carrying out the BISR function typically at the time the power supply is turned on. Thus, the present invention exhibits an effect to increase the probability of rescuing the chip from abnormal bits.

In addition, by storing information obtained as a result of evaluation of individual memory cells to determine whether the memory cells are good or defective in a buffer as a smallest amount of address information required for determining redundant lines each to serve as a substitute for an abnormal memory cell, the BISR function can be implemented by using a small size of the buffer and a small circuit scale in comparison with a case in which all address information obtained as the evaluation result is stored in a buffer. In addition, since a repair search is carried out in the same chip as the memory unit, the repair search can be carried out at a high processing speed.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 4 is a diagram concretely showing a result of a process carried out by the repair search circuit;

FIG. 5 is a block diagram showing a configuration in which 2 redundant lines are connected to all redundant blocks in a Y direction (or a spit-form direction) and 2 redundant lines are connected to each of the redundant blocks in an X direction;

DETAILED DESCRIPTION OF THE PREFERRED EMBODIMENTS

Preferred embodiments of the present invention are described in detail by referring to the diagrams as follows.

Figure 1:
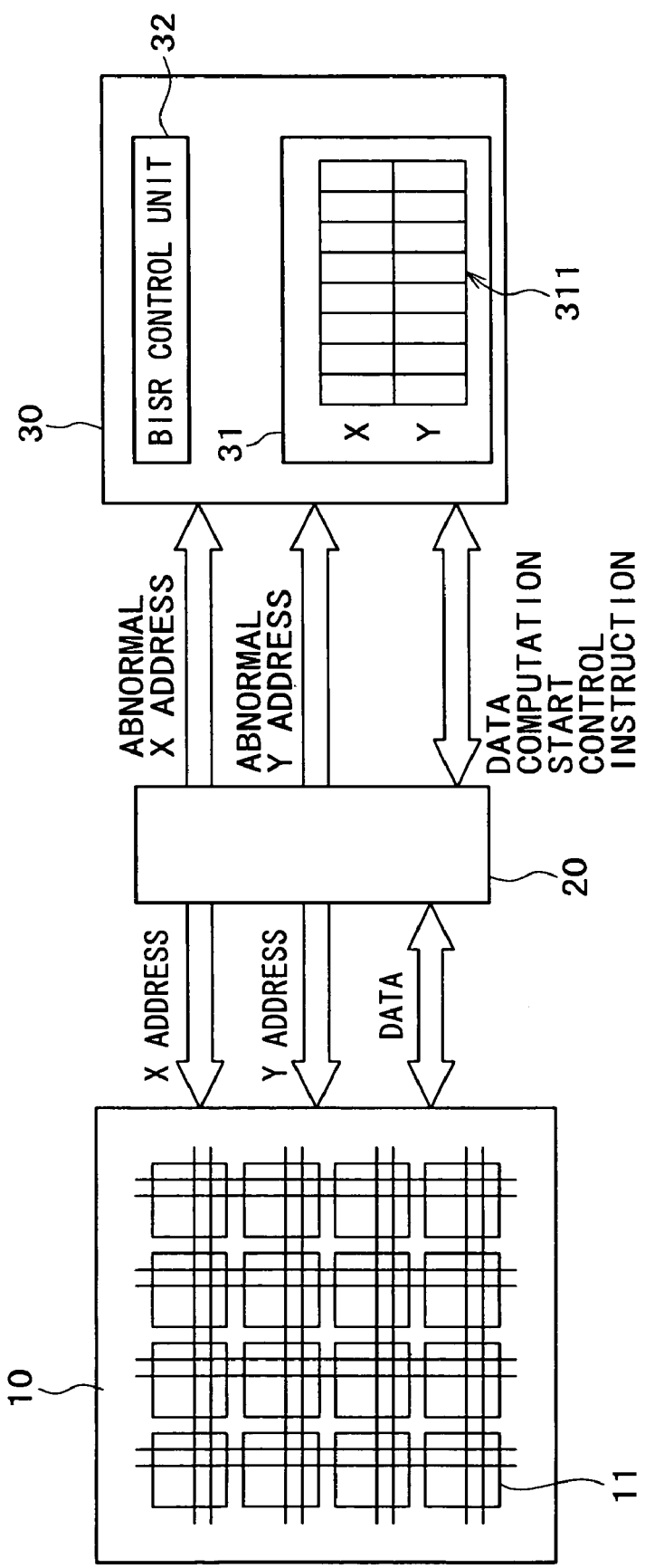
FIG. 1 is a block diagram showing the configuration of a semiconductor memory apparatus implemented by an embodiment of the present invention.

FIG. 1 is a block diagram showing a typical configuration of a semiconductor memory apparatus implemented by an embodiment of the present invention. As is obvious from FIG. 1, the semiconductor memory apparatus implemented by the embodiment as an LSI chip includes a RAM (or memory unit) 10 such as a DRAM or an SRAM, a BIST (Built-In Self-Test) circuit 20 and a BISR (Built-In Self-Repair) circuit 30. The RAM 10, the BIST circuit 20 and the BISR circuit 30 are included in the same LSI chip.

Figure 2:
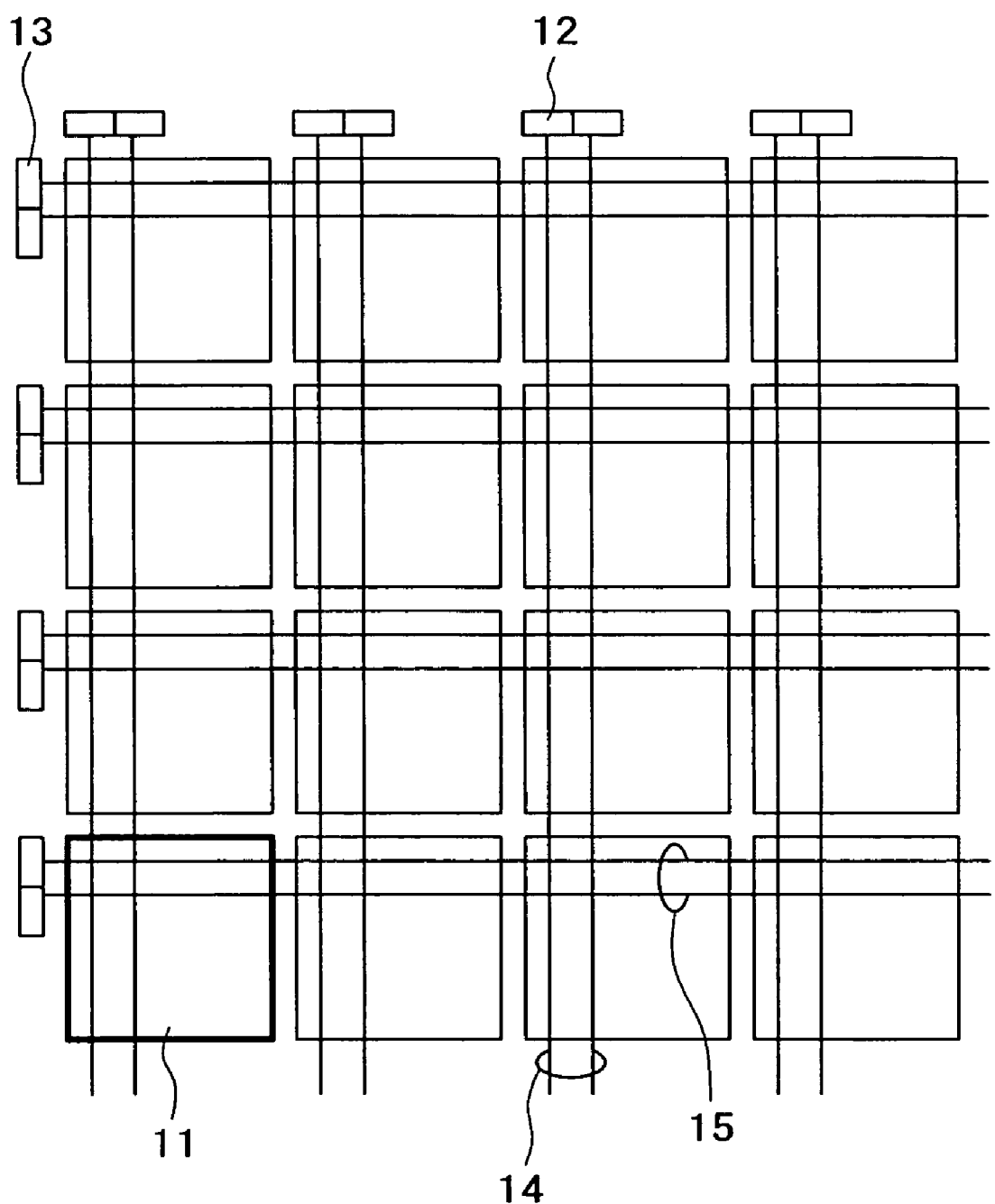
FIG. 2 is a block diagram showing a typical configuration of a RAM.

As shown in FIG. 2, the RAM 10 generally includes small unit blocks 11 having a memory core, which includes a plurality of memory cells laid out to form a matrix, and spare memory cells each serving as a redundant memory cell used for repairing an abnormal memory cell generated in a memory core. The small unit blocks 11 are each referred to hereafter as a redundant block 11. A number of such redundant blocks 11 is also arranged to form a plurality of matrixes. In some cases, the redundant blocks 11 are arranged to form a matrix. Ideally, mechanical fuses 12 and 13 of wires made of a material such as Al (aluminum) are on the row and column of redundant blocks 11 so that the redundant blocks 11 can be used in a repair independently.

In actuality, however, the mechanical fuses 12 and 13 have a large size, raising a mounting problem. In order to solve this problem, redundant lines are used by being shared by a plurality of redundant blocks 11 included in a group to provide a configuration in which each group has mechanical fuses 12 and 13. To put it concretely, a row redundant line 14 is connected by penetrating a plurality of redundant blocks 11 in a so-called spit form for each column, while a column redundant line 15 is connected by penetrating a plurality of redundant blocks 11 in the spit form for each row. Each redundant line 14 and 15 is provided with the fuses 12 and 13. In addition to the mechanical fuses 12 and 13, a register-fuse is also provided as a fuse to be used in a repair work.

The BIST circuit 20 evaluates each memory cell in the RAM 10 of the configuration described above to evaluate whether or not the memory cell is normal or defective. To put it concretely, the BIST circuit 20 inspects each redundant block 11 to determine whether or not an abnormal bit (a defective or bad memory cell) exists in the redundant block 11. If an abnormal bit exists in a redundant block 11, the BIST circuit 20 determines what address the abnormal bit is located at a high LSI operating speed. Information on the address of the abnormal bit detected by the BIST circuit 20 is supplied to the BISR circuit 30.

In order to implement the repair function, the BISR circuit 30 is designed into a configuration including a repair-search circuit 31 and a BISR control unit 32. In the BISR circuit 30, the repair-search circuit 31 processes the information supplied by the BIST circuit 20 as information on the address of the abnormal bit in a real-time manner. The repair-search circuit 31 confirms a smallest amount of address information required for determining which redundant line (or a redundant memory cell) is to be used as a replacement of the abnormal bit. A buffer (memory) unit 311 is provided in the LSI chip as storage means for storing only this smallest amount of address information on addresses. The information on the address of an abnormal bit is expressed in terms of a pair of row and column addresses. The addresses composing the pair are referred to as X and Y addresses.

The following description explains a series of processes in which the BIST circuit 20 inspects each redundant block 11 in order to determine whether or not an abnormal bit exists in the redundant block 11 at the LSI operating speed and the repair-search circuit 31 carries out processing on information on the address of the abnormal bit in a real-time manner, storing the information in the buffer unit 311. The description begins with consideration of the storage capacity of the buffer unit 311 required for storing information on addresses in the LSI chip. The storage capacity of the buffer unit 311 is referred to simply as a buffer size. It is to be noted that address information stored in the buffer unit 311 is expressed in terms of a pair of X and Y addresses.

Let notations m and n denote the number of usable redundant lines in the X direction and the Y direction respectively where the X direction is the direction of the X axis whereas the Y direction is the direction of the Y axis. In this case, if at least (n+1) abnormal bits exist at a Y address, the line of this Y address must be replaced with a redundant line in the X direction unconditionally. By the same token, if at least (m+1) abnormal bits exist at an X address, the line of this X address must be replaced with a redundant line in the Y direction unconditionally.

Thus, a buffer size of m pairs is a sufficient buffer size required for 1 redundant line in the Y direction. By the same token, a buffer size of n pairs is an adequate buffer size required for 1 redundant line in the X direction. The reasoning leading to such buffer sizes is explained as follows. Consider a redundant line in the Y direction and think of pairs of abnormal addresses. If Y addresses with the same X address are abnormal, up to m pairs need to be stored in the buffer unit 311. This is because, when the (m+1)th address becomes abnormal, the X address is confirmed as a repair address so that it is not necessary to store the (m+1)th pair. This reasoning applies to a redundant line in the X direction.

Thus, since there are m redundant lines in the X direction, the buffer size required for all the redundant lines in the X direction is m×n. By the same token, since there are n redundant lines in the Y direction, the buffer size required for all the redundant lines in the Y direction is n×m. Thus, a total buffer size of 2×m×n pairs is sufficient.

Take a configuration of the RAM 10 shown in FIG. 2 as an example. In this typical configuration, both m and n are 2. That is to say, the number of row redundant lines 14 and the number of column redundant lines 15 are both 2. In the case of this typical configuration, a buffer unit 311 having a buffer size of 8 (=2×2×2) pairs of X and Y addresses per redundant block 11 is adequate.

Figure 3:
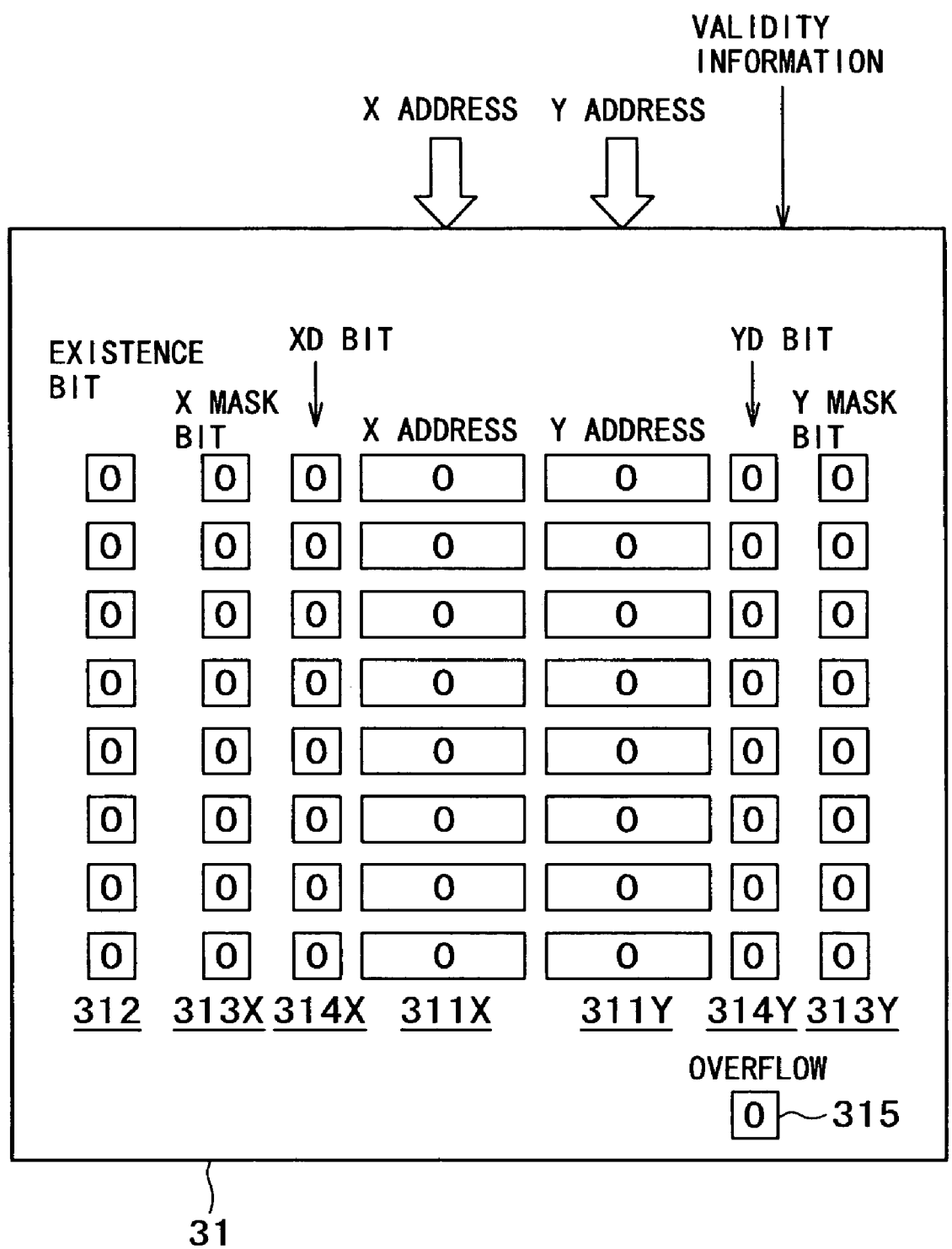
FIG. 3 is a block diagram concretely showing a typical configuration of a repair search circuit.

FIG. 3 is a block diagram showing a concrete configuration of the repair-search circuit 31. The repair-search circuit 31 of this embodiment has a buffer unit 311 including 8 X-address storage locations 311X and 8 Y-address storage locations 311Y for the 2 row redundant lines 14 and the 2 column redundant lines 15. In addition, the repair-search circuit 31 includes 8 existence bits 312, mask bits 313, D bits 314 and an overflow bit 315. In actuality, the mask bits 313 are 8 X mask bits 313X and 8 Y mask bits 313Y. By the same token, the D bits 314 are 8 XD bits 314X and 8 YD bits 314Y.

Associated with a particular one of the X-address storage locations 311X and a particular one of Y-address storage locations 311Y, each of the existence bits 312 has a value of either 1 indicating that a pair of addresses has been stored at the particular X-address storage location 311X and the particular Y-address storage location 311Y, or 0 indicating that the pair of addresses has not been stored therein. The overflow bit 315 has either a value of 0 indicating a state of being repairable by using the redundant lines 14 and 15 or a value of 1 indicating a state of being unrepairable by using the redundant lines 14 and 15. Associated with a particular one of the X-address storage locations 311X, each of the X mask bits 313X in a set state indicates that the X address stored at the particular X-address storage location 311X has been confirmed as a mask address (repair address) to be described later. By the same token, associated with a particular one of the Y-address storage locations 311Y, each of the Y mask bits 313Y in a set state indicates that the Y address stored at the particular Y-address storage location 311Y has been confirmed as a mask address (repair address). Associated with a particular one of the X-address storage locations 311X, each of the XD bits 314X in a set state indicates that the X address stored at the particular X-address storage location 311X was already recorded before at another X-address storage location 311X or is recorded for the second or subsequent time. By the same token, associated with a particular one of the Y-address storage locations 311Y, each of the YD bits 314Y in a set state indicates that the Y address stored at the particular Y-address storage location 311Y was already recorded before at another Y-address storage location 311X or is recorded for the second or subsequent time.

The BISR circuit 30 supplies X and Y addresses and validity-bit information to the repair-search circuit 31 shown in FIG. 3. The X and Y addresses indicate the position of an abnormal bit in the RAM 10 whereas the validity-bit information shows that the supplied X and Y addresses are valid. If the supplied X and Y addresses are valid, the repair-search circuit 31 carries out processes (1) to (5) described as follows.

(1) When a pair of X and Y addresses is received, the repair-search circuit 31 determines whether or not the address pair has been stored at any pair of address storage locations 311X and 311Y provided for X and Y addresses respectively. If the address pair has been stored at any pair of address storage locations 311X and 311Y, the address pair is discarded.

(2) The X mask bit 313X is examined to determine whether or not the value thereof is 1 indicating that the supplied X address has been confirmed as an address to be masked (to undergo a repair). By the same token, the Y mask bit 313Y is examined to determine whether or not the value thereof is 1 indicating that the supplied Y address has been confirmed as an address to be masked. If either of the X and Y addresses has been confirmed as an address to be masked, the pair of X and Y addresses is discarded. The confirmation of an address as an address to be masked is referred to hereafter as a mask confirmation and an address completing a mask confirmation is referred to hereafter as a mask address.

(3) If the pair of supplied X and Y addresses is not discarded in processes (1) and (2), the address pair is stored in a pair of free address storage locations 311X and 311Y, and the existence bit 312 associated with the address storage location pair is set to 1. If the same value as the X address was stored at another X-address storage location 311X in the past, however, the XD bit 314X is also set to 1 to indicate that this X address has already been stored at the other X-address storage location 311X before. Otherwise, if the same value as the Y address was stored at another Y-address storage location 311Y in the past, the YD bit 314Y is also set to 1 to indicate that this Y address has already been stored at the other Y-address storage location 311Y before.

(4) A particular XD bit 314X already set at 1 reveals that a particular X address stored at this particular X-address storage location 311X is the same as an X address stored at another X-address storage location 311X. Thus, if the received X address is the same as the particular X address, the received X address would be stored for the third time. In this case, the X address is confirmed as a mask address by setting the X-mask bit 313X associated with this particular X-address storage location 311X to 1 indicating that the X address has been confirmed as a mask address, and the supplied pair of X and Y addresses is discarded. By the same token, a particular Y-mask bit 313Y already set at 1 reveals that a particular Y address stored at this particular Y-address storage location 311Y is the same as a Y address stored at another Y-address storage location 311Y. Thus, if the received Y address is the same as the particular Y address, the received Y address would be stored for the third time. In this case, the Y address is confirmed as a mask address by setting the Y-mask bit 313Y associated with this particular Y-address storage location 311Y to 1 indicating that the Y address has been confirmed as a mask address, and the supplied pair of X and Y addresses is discarded.

(5) If all the address storage locations 311X and 311Y are found already filled up or no storage area is found in an attempt to store a pair of supplied X and Y addresses in any pair of address storage locations 311X and 311Y, a repair is determined to be impossible. In this case, the overflow bit 315 is set to 1 to indicate an overflow (unrepairable) state and the repair-search circuit 31 completes execution of the series of processes described above.

The series of processes carried out by the repair-search circuit 31 as described above is explained in more detail by giving numerical examples. Consider a case in which the BIST circuit 20 detects abnormal bits in the redundant block 11, and then supplies pairs of X and Y addresses indicating the positions of the abnormal bits sequentially one pair after another to the repair-search circuit 31. In this case, assume that the pairs of X and Y addresses are (12, 5), (6, 5), (12, 8), (5, 35), (12, 6), (6, 35) and (7, 5).

First of all, when the repair-search circuit 31 receives the X and Y addresses of (12, 5), the X and Y addresses are stored at the X-address storage location 311X and the Y-address storage location 311Y respectively as they are since they are a first received pair of X and Y addresses. At that time, the existence bit 312 is set to 1 to indicate that valid X and Y addresses have been stored at the X-address storage location 311X and the Y-address storage location 311Y respectively.

Next, when the repair-search circuit 31 receives the X and Y addresses of (6, 5), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively. In addition, the YD bit 314Y is set to 1 to indicate that the Y address was stored at another Y-address storage location 311Y before.

Next, when the repair-search circuit 31 receives the X and Y addresses of (12, 8), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively. In addition, the XD bit 314X is set to 1 to indicate that the X address was stored at another X-address storage location 311X before.

Next, when the repair-search circuit 31 receives the X and Y addresses of (5, 35), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively.

Next, the repair-search circuit 31 receives the X and Y addresses of (12, 6). The X address of 12 has already been stored at 2 X-address storage locations 311X as evidenced by the value of 1 set in the XD bit 314X associated with the pair of address storage locations for storing the X and Y addresses of (12, 8). Thus, the X address of 12 of the received X and Y addresses of (12, 6) would be stored for the third time. That is to say, there are three address pairs having the same X address of 12 but different Y addresses. In this case, this received pair of (12, 6) is discarded, and the X-mask bit 313X associated with the pair of address storage locations for storing the X and Y addresses of (12, 8) for which the XD bit 314X has been set at 1 is also set to 1 to confirm the X address of 12 as a mask address.

Next, when the repair-search circuit 31 receives the X and Y addresses of (6, 35), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively. In addition, the XD bit 314X is set to 1 to indicate that the X address of 6 was stored at another X-address storage location 311X before, being stored currently for the second time. By the same token, the YD bit 314Y is set to 1 to indicate that the Y address of 35 was also stored at another X-address storage location 311X before, being stored currently for the second time.

Finally, the repair-search circuit 31 receives the X and Y addresses of (7, 5). The Y address of 5 has already been stored at 2 Y-address storage locations 311Y as evidenced by the value of 1 set in the YD bit 314Y associated with the pair of address storage locations for storing the X and Y addresses of (6, 5). Thus, the Y address of 5 of the received X and Y addresses of (7, 5) would be stored for the third time. That is to say, there are three address pairs having the same Y address of 5 but different X addresses. In this case, this received pair of (7, 5) is discarded, and the Y-mask bit 313Y associated with the pair of address storage locations for storing the X and Y addresses of (6, 5) for which the YD bit 314Y has been set at 1 is also set to 1 to confirm the Y address of 5 as a mask address.

As described above, the BIST circuit 20 detects abnormal bits in the redundant block 11, and then supplies pairs of X and Y addresses (12, 5), (6, 5), (12, 8), (5, 35), (12, 6), (6, 35) and (7, 5) indicating the positions of the abnormal bits sequentially one pair after another to the repair-search circuit 31. In this case, as a result of the processing carried out by the repair-search circuit 31, the X-address storage locations 311X, the Y-address storage locations 311Y and the other bits 312 to 315 in the repair-search circuit 31 are set to values shown in FIG. 5.

By creating the BIST circuit 20 and the repair-search circuit 31 in the same LSI chip as the RAM 10, the processes described above can be carried out at a high LSI operating speed. In one of the processes, if an abnormal bit is detected, the address of the abnormal bit is identified. In another process, address information is confirmed as a smallest amount of address information required to determine which redundant line is to be used for repairing the abnormal bit, and only the confirmed address information is stored at mainly the X-address storage locations 311X and the Y-address storage locations 311Y besides the other bits including the X mask bits 313X and Y mask bits 313Y as shown in FIG. 4. As a result, an expensive memory tester capable of carrying out operations at a high speed equal to the LSI operating speed is no longer required.

In addition, the semiconductor memory apparatus has a configuration in which the on-chip process carried out by the repair-search circuit 31 leaves only information on addresses of abnormal bits as information required for an analysis of redundant lines. Thus, it is not necessary to store information on normalcy or abnormality for each address as is the case with the conventional semiconductor memory apparatus. As a result, the size of the buffer unit 311 can be reduced considerably. In addition, the speed of a computation to determine a redundant line to be used for repairing an abnormal memory cell can also be raised as well.

The BISR circuit 30 uses the function of the repair-search circuit 31 as described above to carry out an on-chip repair search in order to determine a mask address even for a configuration in which every plurality of redundant blocks 11 forms a two-dimensional rectangular block in the X and Y directions in two-dimensional grouping, and row redundant lines 14 as well as column redundant lines 15 are connected to the redundant blocks 11 pertaining to the two-dimensional rectangular group in spit forms.

As a base configuration, the BISR circuit 30 adopts a configuration in which redundant blocks 11 form a one-dimensional group in one-dimensional grouping. First of all, a configuration conforming to this one-dimensional grouping is explained. To put it concretely, 2 Y-direction row redundant lines 14 are connected to 4 redundant blocks 11 arranged in the Y direction to form a spit shape in the Y direction, and 2 X-direction column redundant lines 15 are connected to each of the redundant blocks 11 in the X direction as shown in FIG. 5.

Figure 6:
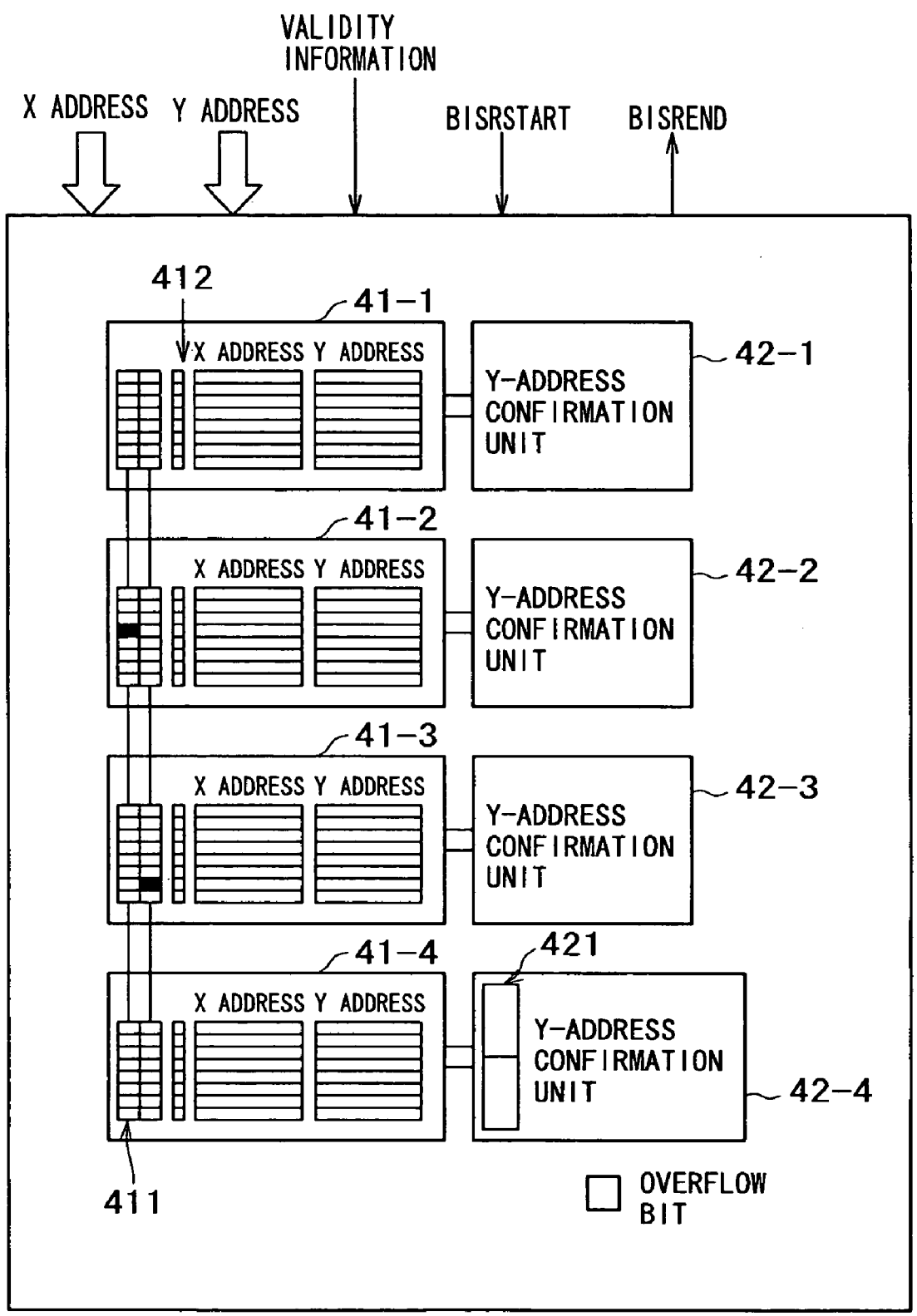
FIG. 6 is a block diagram showing a typical configuration of a BISR circuit conforming to a one-dimensional group.

FIG. 6 is a block diagram showing a typical configuration of the BISR circuit 30' conforming to the one-dimensional group shown in FIG. 5.

As shown in FIG. 6, the typical configuration of the BISR circuit 30' includes buffer units 41-1 to 41-4, which each include address-pair storage locations and flags, and Y-address confirmation units 42-1 to 42-4. The BISR circuit 30' has a function for determining whether or not an abnormal memory cell can be repaired for each of unit blocks 11 pertaining to a second-direction group obtained as a result of the one-dimensional grouping of a plurality of unit blocks 11 in the second direction. In this embodiment, the second direction is the Y direction. An overflow bit is a bit representing a BISR result as to whether or not the address of an abnormal bit is repairable.

When the BIST circuit 20 finishes an evaluation process to determine whether each memory cell is normal or abnormal, the BIST circuit 20 supplies a BISRSTART start signal to start a BISR computation to the BISR circuit 30'. Receiving the BISRSTART start signal, the BISR circuit 30' starts the BISR computation. As the BISR computation is finished, the BISR circuit 30' outputs a BISREND end signal indicating that the BISR computation has been finished.

In the configuration shown in FIG. 6, each of the buffer units 41-1 to 41-4 corresponds to the repair-search circuit 31 included in the configuration shown in FIG. 3. That is to say, the buffer units 41-1 to 41-4 each carry out the repair search described earlier in order to store only fewest possible pairs of X and Y addresses required for determining redundant lines to be used to repair abnormal memory cells for 4 redundant blocks 11.

As many flags as row redundant lines 14 connected in the Y direction are provided for every address-pair storage location in each of the buffer units 41-1 to 41-4. The flags provided for a specific address-pair storage location are linked to flags provided for address-pair storage locations adjacent the specific address-pair storage location to form as many shift registers each having a chain form as the row redundant lines 14 connected in the Y direction in each of the buffer units 41-1 to 41-4. Each of the shift registers in a specific buffer unit is also linked to a corresponding shift register in buffer units adjacent to the specific buffer unit to form a shift-register unit 411. In this embodiment, 2 row redundant lines 14 are connected in the Y direction. XD bits 412 to be referred to in a later explanation are provided for each of the buffer units 41-1 to 41-4.

The Y-address confirmation units 42-1 to 42-4 are used to confirm Y addresses of address pairs, which are left without undergoing mask confirmations of X addresses thereof. In order to confirm a Y address, each of the Y-address confirmation units 42-1 to 42-4 has a Y-address storage unit 421 including Y-address storage locations each used for storing a Y address. Since 2 column redundant lines 15 are connected to each redundant block 11 in the X direction, 2 Y addresses need to be stored in each of the Y-address confirmation units 43-1 to 43-4. Thus, each of the Y-address confirmation units 43-1 to 43-4 has a Y-address storage unit 421, which includes 2 Y-address storage locations.

The following description explains a concrete processing procedure executed in the BISR circuit 30' with the configuration described above to determine a mask address. The processing described below is carried out under control executed by the BISR control unit 32 included in the configuration shown in FIG. 1.

(1) First of all, the BIST circuit 20 is operated to store only fewest possible pairs of abnormal-bit addresses in the buffer units 41-1 to 41-4 as a smallest amount of information required to determine a redundant line to be used for each of the 4 redundant blocks 11.

(2) Next, pointers of the left and right shift registers of the shift register unit 411 in the buffer units 41-1 to 41-4 are positioned to the upper ends to establish a reset state.

(3) Next, in this reset state, an X address pointed to by the pointers of the left and right shift registers is reported to all the buffer units 41-1 to 41-4 to be compared with the corresponding X addresses in the buffer units 41-1 to 41-4. It is then assumed that an address pair including the same X address as the reported one is repaired.

(4) Next, a process is carried out to determine whether or not an address pair that cannot be repaired in process (3) can be masked by using the column redundant lines 15 connected in the X direction. If the address pair cannot be masked, the next process is carried out.

(5) Next, the pointer of the right shift register is shifted down. If the pointer at the new position points to an XD bit 412 already set at 1 indicating that the X-address of an address pair at the address-pair storage location associated with the XD bit 412 has been stored also at another address-pair storage location, the new position is ignored and the pointer is shifted down again.

(6) An X address pointed to by a combination of the pointer positions of the left and right shift registers are reported to all the buffer units 41-1 to 41-4 to be compared with the corresponding X addresses in the buffer units 41-1 to 41-4. It is then assumed that each address pair including the same X address as the reported one is repaired.

(7) Next, the Y-address confirmation units 42-1 to 42-4 associated with the buffer units 41-1 to 41-4 respectively are used to determine whether or not remaining address pairs that cannot be repaired in process (6) can be masked by using the column redundant lines 15 connected in the X direction. If a remaining address pair cannot be masked, the following process is carried out.

(8) The pointer of the right shift register is further shifted down in the same way as process (5) to give a new combination of pointer positions before repeating processes (6) and (7). The operation to produce the new combination of pointer positions before repeating processes (6) and (7) is carried out as follows. After the pointer of the right shift register has been shifted to the lower end, the pointer of the left shift register is shifted down. Much like the right shift register in process (5), if the pointer of the left shift register at the new position points to an XD bit 412 already set at 1 indicating that the X-address of an address pair at the address-pair storage location associated with the XD bit 412 has been stored also at another address-pair storage location, the new position is skipped and the pointer of the left shift register is shifted down again. After the pointer of the left shift register has been shifted, the pointer of the right shift register is positioned back to the upper end. As an alternative, the pointer of the right shift register is shifted upward to a position corresponding to the new position of the left shift register or a position right below the new position.

(9) For every new pointer-position combination generated in process (8) by shifting down the left register as described above, process (6) explained above is carried out to determine whether each address pair can be repaired, and process (7) is performed to determine whether or not each remaining address pair can be masked as described above. If a remaining address pair can be masked, the X address pointed to by the combination of pointer positions of the left and right shift registers is taken as an X mask address. If remaining address pairs cannot be masked for all combinations of pointer positions, an unmaskable state results.

A BISR circuit 30 conforming to the two-dimensional grouping adopts the concept of the BISR circuit 30' applied to the one-dimensional grouping as described above. To put it in detail, on the assumption that a two-dimensional group includes a plurality of second-direction one-dimensional subgroups laid out in the first direction, a confirmation result obtained from application of the method adopted in the BISR circuit 30' as described above to a particular second-direction one-dimensional subgroup is reflected in buffer units for unit blocks pertaining to another second-direction one-dimensional subgroup separated away in the first direction from the particular second-direction one-dimensional subgroup before the BISR circuit 30 functions as a second confirmation function to determine whether or not it is possible to repair an address pair for the unit blocks pertaining to the other second-direction one-dimensional subgroup. In this embodiment, the first and second directions are the X and Y directions respectively. As an example, redundant blocks 11 form a two-dimensional group consisting of 4 columns and 4 rows. In this case, for each of the columns, row redundant lines 14 are each connected to 4 redundant blocks 11 as a common line shared by the unit blocks 11, creating a spit form. By the same token, for each of the rows, column redundant lines 15 are each connected to and shared by 4 redundant blocks 11 as a line common to the unit blocks 11, creating a spit form.

Figure 7:
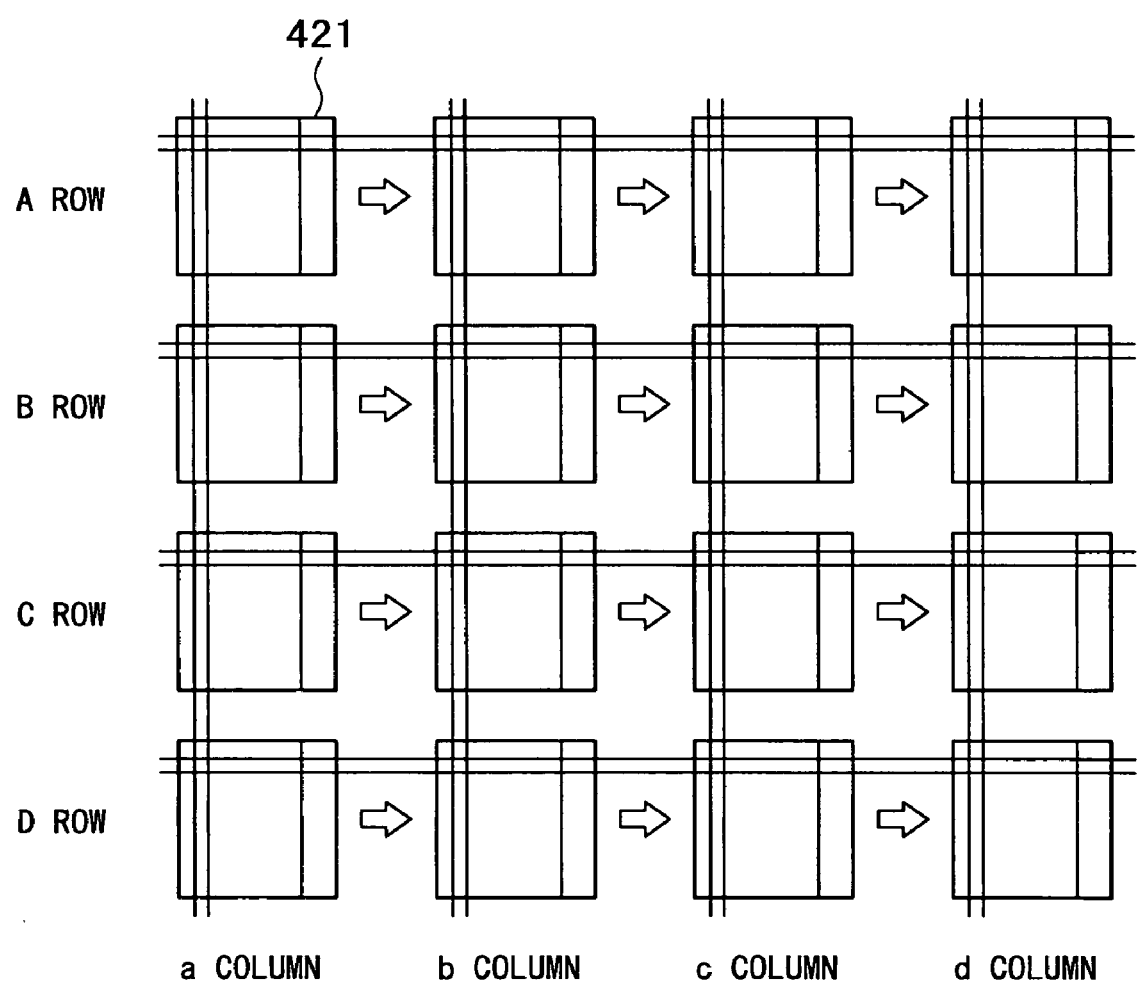
FIG. 7 is a conceptual diagram showing a BISR circuit conforming to a two-dimensional group.

FIG. 7 is a conceptual diagram showing the BISR circuit 30 conforming to a two-dimensional group. The 4 columns and the 4 rows of the two-dimensional group are a, b, c and d columns and A, B, C and D rows respectively. A processing procedure executed by the BISR circuit 30 is explained as follows.

(1) First of all, for the a column, a maskable pattern is found by adopting a one-dimensional algorithm, which is the algorithm applied to the one-dimensional grouping described above. However, the one-dimensional algorithm is not limited to the method described earlier. In the processing to find a maskable pattern, in the Y-address storage unit 421 for the a column, the necessary Y mask address of each row is stored. The Y-address storage unit 421 for the a column corresponds to the Y-address storage unit 421 shown in FIG. 6. A Y mask address is an address completing mask confirmation for the column redundant line 15 connected in the X direction. On the other hand, an X mask address is an address completing mask confirmation for the row redundant line 14 connected in the Y direction.

(2) Next, the Y mask address of each row for the a column is transferred to the buffer units for the b column. At that time, an address pair included in the b column as an address pair including the same Y address as a Y address transferred from buffer units for the a column is masked.

(3) Next, by taking an address pair already masked in process (2) into consideration, the one-dimensional algorithm is applied to the b column to find a maskable pattern. At that time, by taking the Y mask addresses of the a column into consideration, an effort is made to prevent the number of Y mask addresses for rows from exceeding the number of column redundant lines 15 connected in the X direction. In the case of this embodiment, the number of column redundant lines 15 connected in the X direction is 2.

(4) If a maskable pattern cannot be found for the b column in process (3), the following sub-processes are sequentially carried out:

Sub-process (1): An address pair masked in process (2) is reset to an unmasked state.

Sub-process (2): Process (1) described above is repeated to find a next maskable pattern for the a column and, then, process (2) as well as the subsequent processes are carried out.

(5) If a maskable pattern is found for the b column in process (3), on the other hand, the Y mask address of each row for the a column and the Y mask address of each row for the b column are transferred to buffer units for the c column. At that time, an address pair included in the c column as an address pair including the same Y address as a Y address transferred from buffer units for the a or b column is masked.

(6) Next, by taking an address pair already masked in process (5) into consideration, the one-dimensional algorithm is applied to the c column to find a maskable pattern. At that time, by taking the Y mask addresses of the a and b columns into consideration, an effort is made to prevent the number of Y mask addresses for rows from exceeding the number of column redundant lines 15 connected in the X direction.

(7) If a maskable pattern cannot be found in process (6), the following sub-processes are sequentially carried out:

Sub-process (1): An address pair masked in process (5) is reset to an unmasked state.

Sub-process (2): Process (3) described above is repeated to find a next maskable pattern for the b column.

Sub-process (3): If the next maskable pattern cannot be found, the setting of the b column is reset and, then, process (1) described above is repeated to find a next maskable pattern for the a column.

(8) Thereafter, the same processes as the ones described above are repeated.

Embodiment Conforming to Two-Dimensional Grouping

Figure 8:
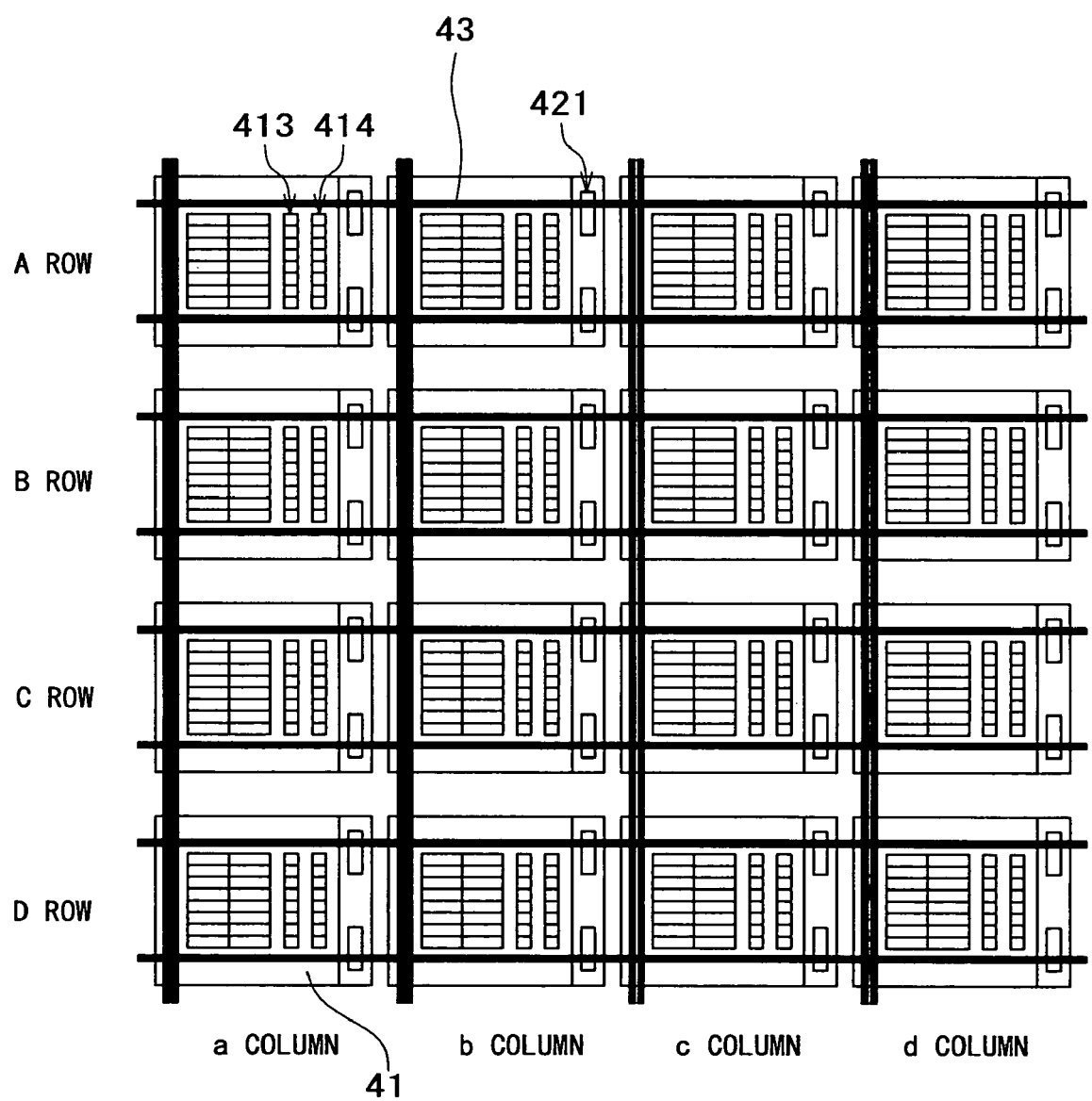
FIG. 8 is a block diagram showing a concrete configuration of the BISR circuit conforming to a two-dimensional group.

The following description concretely explains the configuration of the BISR circuit 30, which is based on the basic concept described above to conform to the two-dimensional grouping. FIG. 8 is a block diagram showing the concrete configuration of the BISR circuit 30 conforming to a two-dimensional group. In the configuration shown in FIG. 8, a buffer unit 41 is provided for each of redundant blocks 11, which form a two-dimensional group consisting of 4 columns and 4 rows. The buffer unit 41 provided for each redundant block 11 corresponds to each of the buffer units 41-1 to 41-4 shown in FIG. 6. The buffer unit 41 includes flags each indicating the address pair of an abnormal bit, determined-mask bits 413 and set-mask bits 414.

The determined-mask bit 413 is an abnormality bit indicating that an address pair in the unit block 11 has been determined (or confirmed) as an address pair to be masked. For example, an X or Y mask address is determined for a unit block 11. In this case, the determined-mask bit 413 provided for an address pair indicates that the address pair includes an X or Y address matching the determined X or Y mask address. If another flag provided for each address pair as a flag, which indicates that the address pair is the address pair of an abnormal bit, can serve as the substitute for the determined-mask bit 413, it is not necessary to provide the determined-mask bit 413 separately. The set-mask bit 414 of an address pair indicates that the address pair has been assumed to be an address pair, which has already been masked.

The following description explains a concrete processing procedure executed by the BISR circuit 30 having the configuration described above to determine a mask address. The processing procedure is carried out under control executed by the BISR control unit 32 included in the configuration shown in FIG. 1.

(1) First of all, all the mask bits 414 are cleared.

(2) Then, a maskable X address is found for the a column by adoption of the one-dimensional algorithm. At that time, a computed Y mask address is stored in the Y-address storage unit 421.

(3) The Y mask addressed stored in the Y-address storage unit 421 is reported to the buffer units 41 provided for the b column by way of a Y-address notification line 43. At that time, the Y mask addressed stored in the Y-address storage unit 421 can also be reported to the buffer units 41 provided for the c and d columns too.

(4) In the buffer units 41 provided for the b column, the set-mask bit 414 provided for an address pair including a Y address matching the reported Y address appearing on the Y-address notification line 43 is set.

(5) A maskable address-pair pattern is found for the b column by adoption of the one-dimensional algorithm by taking the set mask bits 414 into consideration. That is to say, it is not necessary to mask an address pair, which is associated with a set mask bit 414 put in a set state, by using an X address of the b column since such a set mask bit 414 indicates that the address pair has been masked. In order to exclude such an address pair from the search, the one-dimensional algorithm needs to be improved. To put it concretely, the one-dimensional algorithm skips not only address pairs each associated with an XD bit 412 put in a set state but also address pairs each associated with a set mask bit 414 put in a set state.

(6) Next, only a Y address is fetched from an address pair remaining in the buffer units 41 provided for the b column as an address pair not confirmed as a repairable address pair and stored in the Y-address storage unit 421. This Y address is also asserted on an available one of address buses composing the Y-address notification line 43. In this case, if the number of Y mask addresses exceeds the number of redundant lines connected in the X direction, an overflow occurs on the Y-address notification line 43, indicating an unmaskable state. In this embodiment, the number of redundant lines connected in the X direction is 2.

(7) If an unmaskable state cited above results, the following sub-processes are carried out:

Sub-process (1): The set mask bits 414 and Y-address storage unit 421 of the buffer units 41 provided for the b column are reset.

Sub-process (2): Then, process (2) described above is repeated to find a next maskable pattern of the a column.

(8) If a maskable pattern is found in process (6), the set-mask bit 414 of an address pair included in the buffer units 41 provided for the c column as an address pair including a Y address, which matches the Y address appearing on the Y-address notification line 43, is set. At that time, the set-mask bit 414 of an address pair included in the buffer units 41 provided for the d column as an address pair including a Y address, which matches the Y address appearing on the Y-address notification line 43, can also be set. As an alternative, the set-mask bit 414 of an address pair included in the buffer units 41 provided for each of the a to d columns as an address pair including a Y address, which matches the Y address appearing on the Y-address notification line 43, may also be set as well.

(9) By taking the set mask bits 414 in the buffer units 41 provided for the c column into consideration, the one-dimensional algorithm is applied to buffer units 41 provided for the c column to find a maskable pattern. That is to say, the one-dimensional algorithm is applied by skipping address pairs each associated with the set-mask bit 414 put in a set state.

(10) Next, only a Y address is fetched from an address pair remaining in the buffer units 41 provided for the c column as an address pair not confirmed as a repairable address pair, and stored in the Y-address storage unit 421. This Y address is also asserted on an available bus of the Y-address notification line 43. In this case, if the number of Y mask addresses exceeds the number of redundant lines connected in the X direction, an overflow occurs on the Y-address notification line 43, indicating an unmaskable state.

(11) If an unmaskable state cited above results, the following sub-processes are carried out:

Sub-process (1): The set mask bits 414 and Y-address storage unit 421 of the buffer units 41 provided for the c column are reset.

Sub-process (2): Then, process (5) described above is repeated to find a next maskable pattern of the b column.

Sub-process (3): If a next maskable pattern of the b column is not found, the set mask bits 414 and Y-address storage unit 421 of the buffer units 41 provided for the b column are reset. Then, process (2) described above is repeated to find a next maskable pattern of the a column.

(12) Thereafter, the same processes as the ones described above are repeated.

Figure 9B:
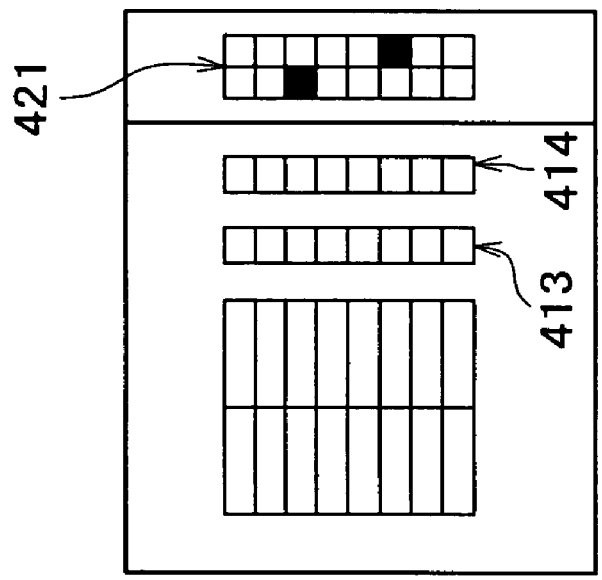
FIGS. 9A and 9B are diagrams showing typical configurations of embodiments each implementing a Y-mask-address storage unit.
Figure 9A:
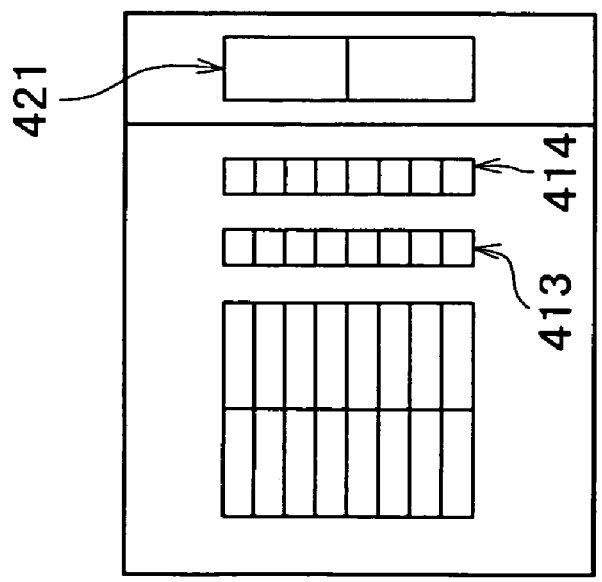

FIGS. 9A and 9B are diagrams showing typical configurations of embodiments each implementing the Y-maskaddress storage unit 421. As shown in FIG. 9A, the typical configuration of the Y-address storage unit 421 has as many Y-address storage locations as the column redundant lines 15 connected in the X direction. In the typical configuration shown in FIG. 9B on the other hand, the Y-address storage unit 421 includes as many shift registers as the row redundant lines 14 connected in the Y direction. The setting of these shift registers points to a Y mask address.

Figure 10A:
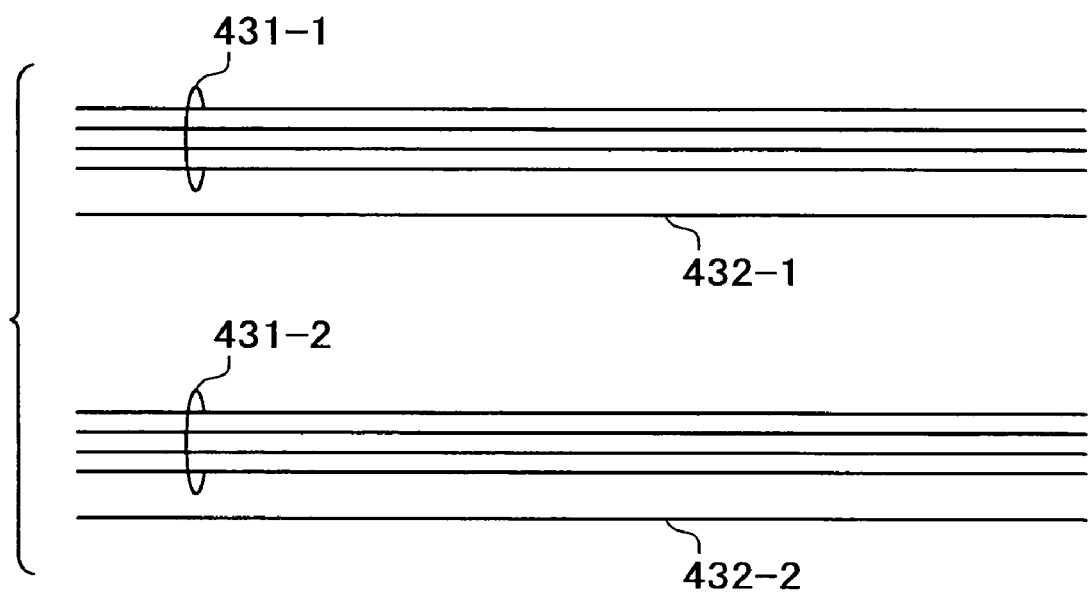
FIGS. 10A and 10B are diagrams showing typical configurations of embodiments each implementing a Y-address notification line.
Figure 10B:
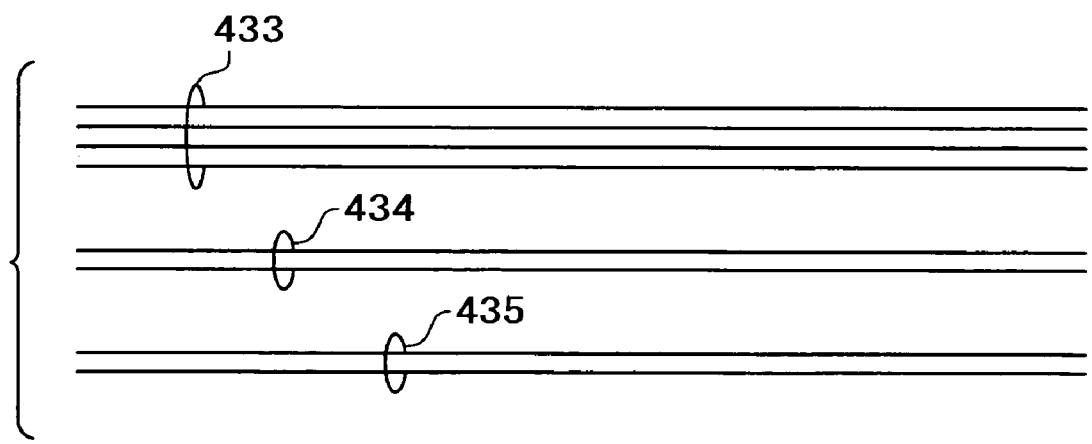

FIGS. 10A and 10B are diagrams showing typical configurations of embodiments each implementing the Y-address notification line 43. As shown in FIG. 10A, the configuration of the Y-address notification line 43 includes as many address buses 431-1 and 431-2 as the column redundant lines 15 connected in the X direction. This configuration also includes usage bit lines 432-1 and 432-2 for the address buses 431-1 and 431-2 respectively. The usage bit lines 432-1 and 432-2 indicate whether or not the address buses 431-1 and 431-2 respectively are being used. The usage bit lines 432-1 and 432-2 all put in a set state indicate that all the column redundant lines 15 connected in the X direction are being used so that no more column redundant lines 15 connected in the X direction can be used.

On the other hand, the configuration of the Y-address notification line 43 shown in FIG. 10B includes an address bus 433, usage bit lines 434 and select bit lines 435. The usage bit lines 434 indicate the state of utilization of the column redundant lines 15 connected in the X direction. The select bit lines 435 indicate a column redundant line 15, the address of which is appearing on the address bus 433.

As many usage bit lines 434 as the column redundant lines 15 connected in the X direction are provided. The usage bit lines 434 can also be used in a way so that a usage bit line 434 put in a set state indicates that the column redundant line 15 associated with the line 434 has been used. As an alternative, the usage bit lines 434 can also be used in a way that their value is a binary number indicating the number of column redundant lines 15 already used. By the same token, as many select bit lines 435 as the column redundant lines 15 connected in the X direction are provided. The select bit lines 435 can also be used in a way so that a select bit line 435 put in a set state indicates that the address of the column redundant line 15 associated with the line 435 is appearing on the address bus 433. As an alternative, the select bit lines 435 can also be used in a way that their value is a binary number indicating a number assigned to a column redundant line 15, the address of which is appearing on the address bus 433.

To put it concretely, in order to find an unused column redundant line 15 after a new Y address is determined, the usage bit lines 434 are examined to determine whether or not such an unused column redundant line 15 exists. If such an unused column redundant line 15 exists, the states of the usage bit lines 434 are changed to indicate that the number of column redundant lines 15 already used has been incremented by 1. If the states of the usage bit lines 434 are indicating that all the column redundant lines 15 connected in the X direction have already been used, no more column redundant lines 15 can be used. In this case, the states of the usage bit lines 434 can no longer be changed, meaning that an unrepairable state results.

As described above, the select bit lines 435 indicate a column redundant line 15, the address of which is appearing as a Y address on the address bus 433. The values of select bit lines 435 may include a value indicating that no Y address is appearing on the address bus 433. If the number of column redundant lines 15 connected in the X direction is 2, only 1 select bit line 435 is sufficient. In this case, the 2 values of the select bit line 435, i.e., 0 and 1, indicate which column redundant line 15 has an address appearing on the address bus 433. As an alternative, 2 select bit lines 435 can also be used. In this case, a select bit line 435 put in a set state indicates that the column redundant line 15 associated with the select bit line 435 has an address appearing on the address bus 433.

As described above, the BISR circuit 30 conforming to the two-dimensional grouping carries out a repair search on the chip including the BISR circuit 30 typically when the user turns on the power supply of the product employing the chip. By storing a determined mask address in typically a fuse based on a register, a self-repair work can be carried out on the chip.

While preferred embodiments of the present invention have been described using specific terms, such description is for illustrative purposes only, and it is to be understood that changes and variations may be made without departing from the spirit or scope of the following claims.

What is claimed is:

1. A semiconductor memory apparatus comprising a memory unit having unit blocks each including:
    a memory core including a plurality of memory cells laid out to form a cell matrix; and
    redundant lines including redundant memory cells each used for repairing an abnormal memory cell generated in any of said memory cores, wherein:
    said unit blocks are further laid out to form a block matrix or a plurality of block matrixes, and every plurality of said unit blocks forms a two-dimensional group oriented in a first direction (row or column direction) and a second direction (column or row direction); and
    said redundant lines are shared by said unit blocks pertaining to said two-dimensional group in both said first and second directions;
    self-test means mounted in the same chip as said memory unit to serve as embedded self-test means for evaluating said memory cells in order to determine whether said memory cells are good or defective; and
    self-repair means mounted in said same chip as said memory unit to serve as embedded self-repair means for:
    selecting only a minimum number of address pairs among address pairs received from said self-test means as address pairs each comprising a first-direction address (row or column address) and second-direction address (column or row address) of an abnormal memory cell;
    storing said selected minimum number of address pairs in storage means provided for each of said unit blocks as address pairs required for determining a redundant line to be used for repairing an abnormal memory cell; and
    finding a redundant line to be used for repairing an abnormal memory cell for each of said unit blocks pertaining to said two-dimensional group on the basis of address pairs stored in said storage means.

2. A semiconductor memory apparatus according to claim 1 wherein said embedded self-repair means comprises:
    first confirmation means for determining whether or not it is possible to repair an abnormal memory cell in each of said unit blocks pertaining to each of second-direction one-dimensional subgroups composing said two-dimensional group; and
    second confirmation means for reflecting a determination result produced by said first confirmation means for any particular one of said second-direction one-dimensional subgroups in said unit blocks pertaining to any other one of said second-direction one-dimensional subgroups, which is provided at a location separated away in said first direction from said particular second-direction one-dimensional subgroup, and determining whether or not it is possible to repair an abnormal memory cell in each of said unit blocks pertaining to said other second-direction one-dimensional subgroup.

3. A semiconductor memory apparatus according to claim 2 wherein said embedded self-repair means has an address notification line for reporting information on a first-direction address determined to be repairable by said first confirmation means from any particular one of said second-direction one-dimensional subgroups to any other one of said second-direction one-dimensional subgroups, which is provided at a location separated away in said first direction from said particular second-direction one-dimensional subgroup.

4. A semiconductor memory apparatus according to claim 3 wherein said address notification line comprises as many address buses as said redundant lines connected in said first direction and usage bit lines for indicating states of utilization of said address buses.

5. A semiconductor memory apparatus according to claim 3 wherein said address notification line comprises an address bus, usage bit lines for indicating the number of currently used redundant lines connected in said first direction and select bit lines for indicating which redundant line connected in said first direction has an address thereof appearing on said address bus.

6. A self-repair method adopted in a semiconductor memory apparatus comprising: a memory unit having unit blocks each including:
  a memory core including a plurality of memory cells laid out to form a cell matrix; and
  redundant lines including redundant memory cells each used for repairing an abnormal memory cell generated in any of said memory cores, wherein:
  said unit blocks are further laid out to form a block matrix or a plurality of block matrixes, and every plurality of said unit blocks forms a two-dimensional group oriented in a first direction (row or column direction) and a second direction (column or row direction); and
  said redundant lines are shared by said unit blocks pertaining to said two-dimensional group in both said first and second directions; and
  self-test means mounted in the same chip as said memory unit to serve as embedded self-test means for evaluating said memory cells in order to determine whether said memory cells are good or defective, said self-repair method comprising:
  a storage process of storing address pairs each consisting a first-direction address (a row address or a column address) and second-direction address (column address or row address) of an abnormal memory cell in storage means provided for each of said unit blocks;
  a first confirmation process of determining whether or not it is possible to repair an abnormal memory cell in each of said unit blocks sharing said redundant lines connected in said second direction and pertaining to any particular one of second-direction one-dimensional subgroups composing said two-dimensional group on the basis of address pairs stored in said storage means in said-storage process; and
  a second confirmation process of reflecting a determination result produced in said first confirmation process for any particular one of said second-direction one-dimensional subgroups in said unit blocks pertaining to any other one of said second-direction one-dimensional subgroups, which is provided at a location separated away in said first direction from said particular second-direction one-dimensional subgroup, and determining whether or not it is possible to repair an abnormal memory cell in each of said unit blocks pertaining to said other second-direction one-dimensional subgroup,
  whereby said first and second confirmation processes are carried out repeatedly to determine whether or not it is possible to repair an abnormal memory cell in each of said unit blocks pertaining to said two-dimensional subgroup.

7. A self-repair method according to claim 6 wherein said first confirmation process comprises:
  a first sub-process of generating a pattern of an address set of a second-direction address on the basis of an address pair stored in said storage means for said unit blocks pertaining to said particular second-direction one-dimensional subgroup;
  a second sub-process of regarding said generated address set of said second-direction address as a repair address, reporting said address set to all said unit blocks pertaining to said particular second-direction one-dimensional subgroup and determining whether or not it is possible to repair the address pair of an abnormal memory cell, which cannot be repaired by said address set, by using any one of said redundant lines connected in said first direction for all said unit blocks pertaining to said particular second-direction one-dimensional subgroup; and
  a third sub-process of generating a next address set to be used for determining whether or not it is possible to repair the address pair of an abnormal memory cell for all said unit blocks pertaining to said particular second-direction one-dimensional subgroup if a result of said second sub-process indicates that the address pair of an abnormal memory cell is left in an unrepairable state in any of said unit blocks pertaining to said particular second-direction one-dimensional subgroup,
  whereby said sub-processes are carried out repeatedly to determine second-direction repair addresses.

8. A self-repair method according to claim 6 wherein, on the assumption that said second-direction one-dimensional subgroups are named a first subgroup, a second subgroup, a third subgroup - - - and a Nth subgroup, said second confirmation process comprises the steps of:
  finding an address set of a second-direction repair address in said first subgroup by applying an algorithm adopted in said first confirmation process to said unit blocks pertaining to said first subgroup;
  determining a plurality of candidates for an address set of a first-direction repair address in said first subgroup on the basis of said address set of a second-direction repair address in said first subgroup, reporting one of said candidates to said second subgroup and finding an address set of a second-direction repair address in said second subgroup by taking an effect of said reported candidate into consideration;
  determining a plurality of candidates for an address set of a first-direction repair address in said second subgroup on the basis of said address set of a second-direction repair address in said second subgroup, reporting one of said candidates and said address set of a first-direction repair address in said first subgroup to said third subgroup and finding an address set of a second-direction repair address in said third subgroup by taking an effect of said reported candidate and said address set of a first-direction repair address in said first subgroup into consideration; and
  executing said above step thereafter repeatedly till said Nth subgroup is reached to determine a first-direction repair address and a second-direction repair address for each of said subgroups.

9. A self-repair method according to claim 8 whereby, if the number of first-direction repair addresses exceeds the number of redundant lines connected in said second direction in the course of an operation carried out as part of said second confirmation process to determine first-direction repair addresses and second-direction repair addresses for all said second-direction one-dimensional subgroups, an unrepairable state is determined and, if a repairable pattern is not found in a particular one of said second-direction one-dimensional subgroups, said second confirmation process is repeated by starting from a previous one of said second-direction one-dimensional subgroups, which immediately precedes said particular second-direction one-dimensional subgroup, to further find a next address set in said immediately preceding second-direction one-dimensional subgroup.

10. A self-repair method according to claim 8 whereby, in said second confirmation process, first-direction repair addresses reported to the (n+1)th subgroup as first-direction repair addresses of the first to nth subgroups are also reported to the (n+2)th and subsequent subgroups at the same time or also reported to all said subgroups at the same time where 2<n<N.

11. A self-repair method according to claim 8 whereby, in said second confirmation process:

first-direction repair addresses reported to the (n+1)th subgroup as first-direction repair addresses of the first to nth subgroups are also reported to the (n+2)th and subsequent subgroups at the same time or also reported to all said subgroups at the same time where 2<n<N; and if an address pair having a first direction address matching any one of said reported first-direction repair addresses is found in said storage means, said address pair is assumed to be a repaired address pair.

12. A self-repair method according to claim 11 whereby, in an operation carried out as part of said second confirmation process to assume an address pair to be a repaired address pair, a special bit provided for each of address pairs storable in said storage means is set to indicate that an address pair associated with said set special bit has been assumed to be a repaired address pair.

13. A self-repair method according to claim 8 whereby, in an operation carried out as part of said second confirmation process to determine a second-direction repair address in the nth subgroup by applying an algorithm adopted by said first confirmation process where n has a value in the range 1 to N, first-direction repair addresses reported from other ones of said nth subgroup are taken into consideration.

* * * * *